United States Patent [19]

Jandu

[11] Patent Number: 4,868,417
[45] Date of Patent: Sep. 19, 1989

[54] COMPLEMENTARY VOLTAGE COMPARATOR

[75] Inventor: Jaswinder S. Jandu, Mesa, Ariz.

[73] Assignee: Motorola, Inc., Schaumburg, Ill.

[21] Appl. No.: 235,083

[22] Filed: Aug. 23, 1988

[51] Int. Cl.[4] .............................................. H03K 5/24
[52] U.S. Cl. .................................... 307/355; 307/491; 307/494; 330/295
[58] Field of Search ............... 307/350, 362, 490, 491, 307/494–498, 500, 501; 330/295

[56] References Cited

U.S. PATENT DOCUMENTS 4,228,366 10/1980 Hüttemann et al. ................. 307/496
4,362,956 12/1982 Ogasawara et al. ................. 307/355
4,795,916 1/1989 Liron .................................. 307/355

Primary Examiner—John Zazworsky
Attorney, Agent, or Firm—Mike Bingham

[57] ABSTRACT

A complementary voltage comparator is described wherein a CMOS operational amplifier having an input stage comprising N-channel field effect transistors is coupled with a CMOS operational amplifier having an input stage comprising P-channel field effect transistors. The outputs of the operational amplifiers are converted to currents and combined to indicate the relative magnitudes of the voltages being compared. This configuration allows the range of input voltages to vary over the full range of supply voltages and negates the need for offset correction.

14 Claims, 1 Drawing Sheet

COMPLEMENTARY VOLTAGE COMPARATOR

FIELD OF THE INVENTION

This invention relates in general to voltage comparator circuits and, more particularly, to a monolithically integrated voltage comparator circuit that compares two input voltages which may vary over the entire range of the supply voltages without requiring offset error voltage correction.

BACKGROUND OF THE INVENTION

Operational amplifiers have been widely used in the electronics industry for their many excellent circuit characteristics including high open loop gain, high input impedance, and low output impedance. General applications of the operational amplifier include circuit configurations such as voltage and current amplifiers, differentiators and integrators, active filters, oscillators, and analog to digital and digital to analog converters. To realize these different circuit configurations, operational amplifiers are used in conjunction with positive and or negative feedback in combination with passive and or active elements.

An operational amplifier is also widely used to function as a voltage comparator, wherein typically, a reference signal is applied to the inverting input and the voltage to be compared is applied to the noninverting input. If the voltage to be compared is greater than the reference signal, the output of the comparator equals the magnitude of the positive supply voltage, and if the voltage to be compared is less than the reference signal, the output of the comparator equals the magnitude of negative or ground supply voltage. An inverted voltage comparator may be provided by simply transposing the signals at the inverting and noninverting inputs. Using the operational amplifier as a voltage comparator requires no external components or feedback, and its output has only two states of high and low.

The operational amplifier utilized in the realization of a voltage comparator may be manufactured in bipolar or Complementary Metal Oxide Semiconductor (CMOS) technology or some combination thereof. The CMOS implementation is desireable for its low power consumption characteristic. There are several problems generally associated with the operational amplifier when used in the voltage comparator configuration. The first problem is associated with the range of the voltages that may be compared. Typically, CMOS operational amplifiers cannot accurately compare the two input voltages over the entire range of the positive and ground supply voltages. The second problem associated with all operational amplifiers is that of the offset error voltage. This type of error appears as deviations in the expected output due to imbalances in the input stage which is further a result of statistical deviations in the parameters between transistors. The offset error voltage can be corrected but requires additional external connections.

Another problem known as chatter is also associated with voltage comparators and results in the output switching between states very quickly due to the difficulty of differentiating the two input voltages when the difference in their magnitudes is very small. This may be corrected by incorporating hysteresis in the voltage comparator. This, however, requires feedback utilizing high value resistors, designed for a specific switching point thus reducing flexibility, and hence consuming significant silicon area.

Thus, what is needed is a monolithically integrated voltage comparator circuit that compares two input voltages which may vary over the entire range of the supply voltages without requiring offset error voltage correction.

SUMMARY OF THE INVENTION

Accordingly, it is an object of the present invention to provide an improved voltage comparator circuit.

It is a further object of the present invention to provide an improved voltage comparator circuit that compares two input voltages which may vary over the entire range of the supply voltages.

It is yet a further object of the present invention to provide an improved voltage comparator circuit utilizing operational amplifiers without the need for offset error voltage correction.

Still it is another object of the present invention to provide an improved voltage comparator circuit which does not exhibit the characteristic of chatter.

In carrying out the above and other objects of the invention in one form, there is provided a monolithically integrated voltage comparator circuit for providing an output signal identifying which of first and second input voltages has a greater magnitude, wherein the comparator circuit comprises a first amplifier having inverting and noninverting inputs adapted for receiving the first and second input voltages, respectively, and exhibiting an error voltage therebetween; a second amplifier having inverting and noninverting inputs adapted for receiving the first and second input voltages, respectively, and exhibiting an error voltage therebetween which is different then the error voltage associated with the first amplifier; first and second switching devices coupled to the outputs of the first and second amplifiers, respectively, and each of the first and second switching devices coupled to an output terminal for providing a current when the magnitude of the first voltage is greater than the magnitude of the second voltage; and having a resistor coupled to the output terminal for providing an output voltage in response to the current.

The above and other objects, features, and advantages of the present invention will be better understood from the following detailed description taken in conjunction with the accompanying drawings.

DETAILED DESCRIPTION OF THE INVENTION

Figure 1:
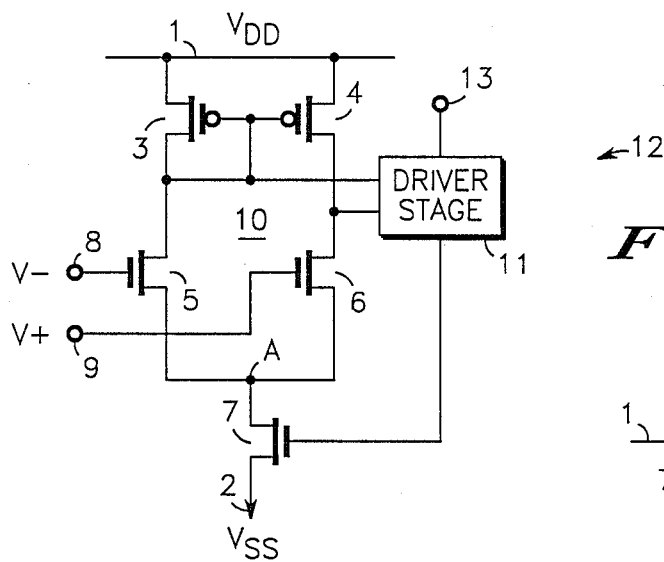
FIG. 1 is a schematic diagram of an amplifier having a differential N-channel input stage.

A CMOS operational amplifier 12, having a differential input stage 10 comprising field effect transistors 3, 4, 5, 6, and 7 is shown in FIG. 1. This is a well known configuration wherein field effect transistors 3, and 4 are P-channel and field effect transistors 5, 6, and 7 are N-channel. The field effect transistors 3 and 4 provide a current mirror function, the field effect transistors 5 and 6 provide inverting and noninverting inputs, respectively, and the field effect transistor 7 provides a source current. A driver stage 11, provides additional amplification of the true and complement voltage signals produced by the differential input stage 10.

The field effect transistors 3 and 4 have their sources coupled to a supply voltage terminal 1, and their gates coupled to the drain of the field effect transistor 3. The drains of the field effect transistors 3 and 4 are connected to the driver stage 11 and provide the complement and true voltage signals, respectively. The field effect transistor 5 has a drain connected to the drain of the field effect transistor 3, a gate connected to an inverting input terminal 8, and a source connected to a node A. The field effect transistor 6 has a drain connected to the drain of the field effect transistor 4, a gate connected to the noninverting input terminal 9, and a source connected to the node A. The field effect transistor 7 has a source connected a supply voltage terminal 2, a gate connected to the driver stage 11 for receiving a bias voltage, and a drain connected to the node A. The driver stage 11 has a driver node 13 for providing an amplifier voltage.

The CMOS operational amplifier as shown in FIG. 1 may operate as a voltage comparator circuit; that is, no external components or feedback is required. If an input voltage, (V−), applied to the inverting input terminal 8 is greater than an input voltage, (V+), applied to the noninverting input terminal 9, the field effect transistor 5 will conduct more current than the field effect transistor 6. By the action of the current mirror, which attempts to keep the currents flowing through the field effect transistors 5 and 6 equal, the complement voltage signal will decrease while the true voltage signal will increase. This in turn causes the driver stage 11 to produce a low amplifier voltage at the driver node 13 indicating that the input voltage, V+, is less than the input voltage, V−.

Conversely, when the input voltage, V+, is greater than the input voltage, V−, the current flowing through the field effect transistor 6 is greater than the current flowing through the field effect transistor 5. The true voltage signal will be greater than the complement voltage signal due to the action of the current mirror and the amplifier voltage will go high.

Figure 2:
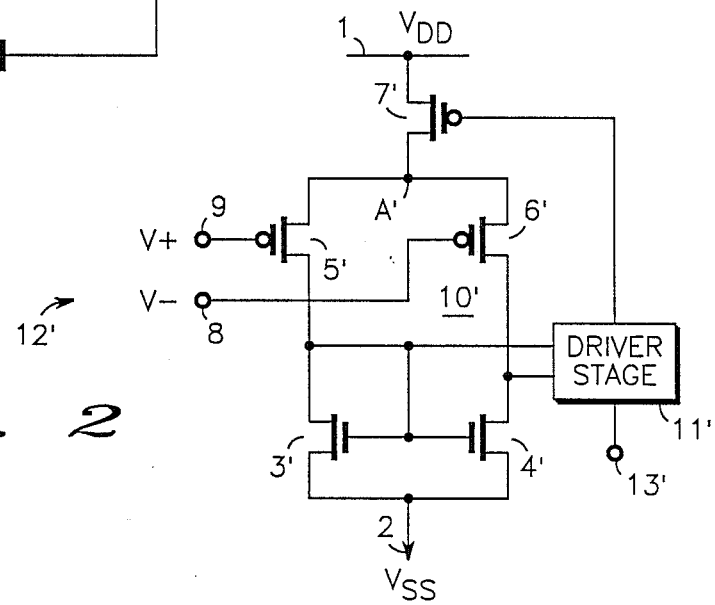
FIG. 2 is a schematic diagram of an amplifier having a differential P-channel input stage.

A second CMOS operational amplifier 12′, having a differential input stage 10′ is depicted in FIG. 2. The differential input stage 10′ is similar to the differential input stage 10 with the following exceptions: the P-channel field effect transistors 3, 4 are replaced by N-channel field effect transistors 3′, and 4′; the N-channel field effect transistors 5, 6, and 7 are replaced by P-channel field effect transistors 5′, 6′, and 7′; the connection of the supply voltage terminals 1 and 2 are transposed; the connection of the inverting and noninverting input terminals 8 and 9, respectively, are transposed; and, the true and complemented voltage signals are reversed as connected to the driver stage 11′.

Like the CMOS operational amplifier 12, the CMOS operational amplifier 12′ may operate as a voltage comparator without additional components or feedback connections. The operation is also similar with a low amplifier voltage being developed at the driver node 13′ when the magnitude of the input voltage, V−, is greater than the magnitude of the input voltage, V+. Also, the amplifier voltage at the driver node 13′ goes high when the magnitude of the input voltage, V+, is greater than the magnitude of the input voltage, V−. While the CMOS operational amplifiers 12 and 12′ operate similarly, there are two very important differences. Firstly, the CMOS operational amplifier 12 is unable to accurately compare the input voltages, V+ and V−, when their magnitudes are within two threshold voltages of the magnitude of the supply voltage ($V_{DD}$) at the supply voltage terminal 1. This is due to the threshold voltage developed across each of the field effect transistors 3, 4, 5, and 6 (i.e. the node A is only able to charge to within two threshold voltages of ($V_{DD}$). Similarly, the operational amplifier 12′ is unable to accurately compare the input voltages, V+ and V−, when their magnitudes are within two threshold voltages of the supply voltage ($V_{SS}$) at the supply voltage terminal 2. This is also due to the threshold voltage developed across each of the field effect transistors 3′, 4′, 5′, and 6′ (the node A′ is only able to discharge down to within two threshold voltages of $V_{SS}$).

The second difference in the performance of the CMOS operational amplifiers 12 and 12′ is a result of an error voltage that exists between the inverting and noninverting input terminals 8 (8′) and 9 (9′), respectively. A typical performance result of having an error voltage in the voltage comparator application is a high amplifier voltage indicating that the input voltage V+ is greater in magnitude than the input voltage V− when in fact the input voltage V− is slightly greater in magnitude than the input voltage V+, or vice versa.

This error voltage is the result of minor differences between the field effect transistors 5 and 6 (5′ and 6′). Although the transistors are designed to have the same performance (i.e. the same channel length and width, and the transistors are laid out having the same orientation), several minor differences exist which are the results of statistical deviations in the transistors as a result of the manufacturing process. For example, the gate oxide thickness may vary by 10 percent or more from one transistor to another on the same wafer, mask alignments cause additional differences in electrical characteristics, contact resistances may vary due to uneven etching rates, and threshold voltages do not remain constant from device to device. There are many other sources of variation which results in slightly different performance from one transistor to another.

Because the differences in transistor performance determines the error voltage, and the differences are further the result of statistical deviations, it is not possible to predict the error voltage and the two CMOS operational amplifiers 12 and 12′ will, to a high probability, have different error voltages.

Figure 3:
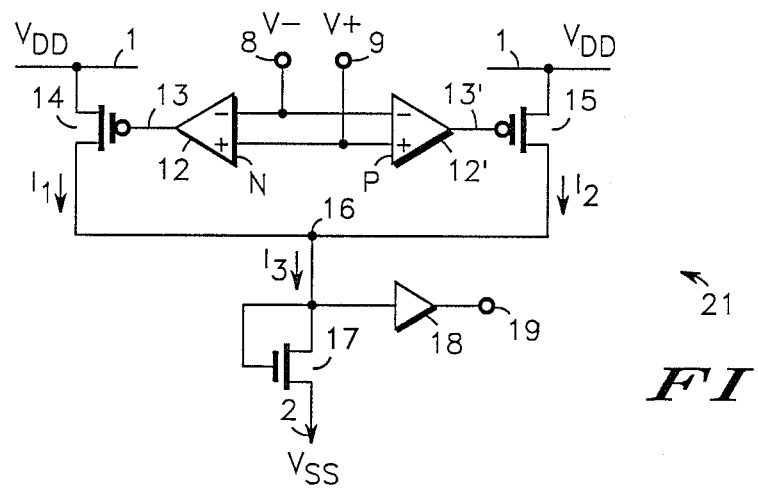
FIG. 3 is a schematic diagram of the present invention.

The problems of different operating ranges and different error voltages between the CMOS operational amplifiers 12 and 12′ are overcome in the complementary voltage comparator 21 as illustrated in FIG. 3. In the complementary voltage comparator 21, the inverting inputs of the CMOS operational amplifiers 12 and 12′ are coupled together to the inverting input terminal 8, and the noninverting inputs of the CMOS operational amplifiers 12 and 12′ are coupled to the noninverting input terminal 9. A field effect transistor 14 has a source connected to the supply voltage terminal 1, a gate connected to the driver node 13, and a drain connected to a node 16. A field effect transistor 15 has a source connected to the supply voltage terminal 1, a gate connected to the driver node 13′, and a drain connected to the node 16. A resistive path to the supply voltage terminal 2 is provided by the field effect transistor 17 which has a gate and a drain connected to the node 16 and a source connected to the supply voltage terminal 2. A buffer 18 has an input connected to the node 16 and an output connected to the output terminal 19. The operation of the complementary voltage comparator 21 is similar to that of an operational amplifier when used as a voltage comparator. The CMOS operational amplifier 12 compares the input voltages, V+ and V−, which results in turning the field effect transistor 14 on or off depending on the magnitudes of the input voltages, V+ and V−, and the error voltage associated with the CMOS operational amplifier 12. For example, if the input voltage V− is greater than the input voltage V+, the node 13 will be low turning on the field effect transistor 14, thus causing a current $I_1$ to flow. When the input voltage V− has the lower magnitude, node 13 will go high turning the field effect transistor 14 off, thereby cutting off the current $I_1$.

Likewise, the CMOS operational amplifier 12' will turn the field effect transistor 15 on or off depending on the magnitudes of the input voltage V+ and V−. This in turn controls a current $I_2$, which may flow into the node 16, or may be cut off. The sum of the currents $I_1$ and $I_2$ produce a third current $I_3$ which flows through the field effect transistor 17. If either currents $I_1$ or $I_2$, or both are flowing, indicating the relative magnitudes of the input voltages, the voltage at the node 16 will go high due to the voltage developed across the field effect transistor 17. If neither currents $I_1$ or $I_2$ are flowing, the field effect transistor 17 will pull the voltage at the node 16 low. The buffer 18 improves the level of the voltage at node 16 and provides additional drive to the output terminal 19.

As described earlier, the CMOS operational amplifiers 12 and 12', individually, are not able to operate over the entire range wherein the input voltages, V+ and V−, vary from the magnitude of $V_{DD}$ to the magnitude of $V_{SS}$. However, by combining the two CMOS operational amplifiers 12 and 12' as shown in FIG. 3, it is now possible to compare the input voltages over the entire operating range of the supply voltages, $V_{DD}$ and $V_{SS}$. If the magnitudes of the input voltages, V+ and V−, are too high for the CMOS operational amplifier 12, then the CMOS operational amplifier 12' will make the comparison. Similarly, if the magnitudes of the input voltages, V+ and V−, are too low for the CMOS operational amplifier 12', then the CMOS operational amplifier 12 will make the comparison.

Furthermore, since the CMOS operational amplifiers 12 and 12' have different error voltages associated with their respective input stages 10 and 10', if one CMOS operational amplifier is operating within that error region, it is highly likely that the other CMOS operational amplifier is not and an accurate comparison may be made. As a result the need for offset correction is negated. Also, if the driver node of one of the CMOS operational amplifiers, 12 or 12', is switching quickly between its high and low state due to the difficulty in discerning a small difference in magnitudes of the input voltages (chatter), the other CMOS operational amplifier will be operating in a more reliable region (due to the differences in error voltages). The output voltage at the output terminal 19 will therefor be stable.

The complementary voltage comparator 21 is made up of common components and is therefor well suited for use in a standard cell type of design. For example, both CMOS operational amplifiers 12 and 12' would typically be included in a standard cell library. The buffer 18 is also typically included in standard cell libraries as well as possible substitutions including inverters and Schmitt triggers.

By now it should be appreciated that there has been provided a monolithically integrated voltage comparator circuit that compares two voltages which may vary over the entire range of the supply voltage rails without requiring offset error voltage correction.

I claim:

1. A comparator circuit having an output identifying which of first and second input voltages has a greater magnitude, said comparator circuit comprising:
   first amplifier means having a different input stage comprising transistor of a first conductivity type with inverting and noninverting inputs adapted for receiving said first and second input voltages, respectively, and providing a first signal exhibiting an error voltage therebetween,
   second amplifier means having a differential input stage comprising transistors of a second conductivity type with inverting and noninverting inputs adapted for receiving said first and second input voltages, respectively, and providing a second signal exhibiting an error voltage therebetween;
   first switching means coupled to said first amplifier means for receiving said first signal and coupled to an output terminal for providing a first current to said output terminal when the magnitude of said first input voltage is greater than the magnitude of said second input voltage;
   second switching means coupled to said second amplifier means for receiving said second signal and coupled to said output terminal for providing a second current to said output terminal when the magnitude of said first input voltage is greater than the magnitude of said second input voltage; and
   means for providing a resistance coupled to said output terminal for providing an output voltage in response to said first and second currents.

2. A comparator circuit according to claim 1 wherein said first and second amplifier means further comprise first and second CMOS operational amplifiers, respectively.

3. A comparator circuit according to claim 1 wherein said first and second switching means further comprise P-channel field effect transistors.

4. A comparator circuit according to claim 1 wherein said means for providing a resistance further comprises a field effect transistor.

5. A comparator circuit according to claim 2 wherein said first CMOS operation amplifier has a differential input stage comprising N-channel field effect transistors.

6. A comparator circuit according to claim 2 wherein said second CMOS operational amplifier has a differential input stage comprising P-channel field effect transistors.

7. A complementary voltage comparator circuit manufactured in monolithically integrated form for comparing first and second input voltages, comprising:
   a first amplifier having a differential input stage comprising transistors of a first conductivity type and having an inverting input coupled for receiving the first input voltage and a noninverting input coupled for receiving the second input voltage, said first operational amplifier providing a first current when the first input voltage is greater than the second input voltage;
   a second amplifier having a differential input stage comprising transistors of a second conductivity type and having an inverting input coupled for receiving the first input voltage and a noninverting input coupled for receiving the second input voltage, said second operational amplifier providing a second current when the first input voltage is greater than the second input voltage; and resistive means coupled to said first and second operational amplifiers for providing an output voltage when either of the first or second currents are present.

8. A complementary voltage comparator circuit according to claim 7 wherein said resistive means further comprises a field effect transistor.

9. A comparator circuit manufactured in monolithically integrated form, said comparator circuit comprising:

a first supply voltage terminal for receiving a first supply voltage;

a second supply voltage terminal for receiving a second supply voltage;

a first input terminal for receiving a first input signal;

a second input terminal for receiving a second input signal;

an output terminal;

a first comparator having an input stage comprising N-channel field effect transistors, said first comparator having an inverting input coupled to said first input terminal, a noninverting input coupled to said second input terminal, and having a driver node;

a second comparator having an input stage comprising P-channel field effect transistors, said second comparator having an inverting input coupled to said first input terminal, a noninverting input coupled to said second input terminal, and having a driver node;

a first transistor coupled between said first supply voltage terminal and said output terminal, and having a control terminal coupled to the driver node of said first comparator;

a second transistor coupled between said first supply voltage terminal and said output terminal, and having a control terminal coupled to the driver node of said second comparator; and means for providing a resistance coupled between said output terminal and said second supply voltage terminal.

10. A comparator circuit according to claim 9 wherein said means for providing a resistance further comprises an N-channel field effect transistor having a gate and a drain coupled to said output terminal, and a source coupled to said second supply voltage terminal.

11. A comparator circuit according to claim 9 wherein said first and second transistors are P-channel field effect transistors.

12. A comparator circuit according to claim 9 further comprising a buffer means having an input coupled to said output terminal and having a driver node for waveshaping the signal at said output terminal.

13. A comparator circuit according to claim 12 wherein said buffer means further comprises a Schmitt trigger.

14. A method of comparing first and second input voltages having magnitudes that may vary over a range defined by the magnitudes of first and second supply voltages comprising the steps of:

comparing said first and second input voltages wherein said first and second input voltages may vary over a range defined by the magnitude of said first supply voltage to a magnitude that is at least two threshold voltages greater than the magnitude of said second supply voltage, and driving a first switching means for providing a first output current when said first input voltage is greater than said second input voltage;

comparing said first and second input voltages wherein said first and second input voltages may vary over a range defined by the magnitude of said second supply voltage to a magnitude that is at least two threshold voltages less than the magnitude of said first supply voltage, and driving a second switching means for providing a second output current when said first voltage is greater than said second voltage; and providing a digital output voltage based on sum of said first and second output currents thereby indicating the difference in magnitudes of said first and second input voltages.

* * * * *